United States Patent [19]

Lee et al.

[11] Patent Number: 4,885,529

[45] Date of Patent: Dec. 5, 1989

[54] IDENTIFICATION OF FLUIDS AND AN INTERFACE BETWEEN FLUIDS BY MEASURING COMPLEX IMPEDANCE

[76] Inventors: David O. Lee, 6409 Quemado N.E., Albuquerque, N. Mex. 87109; James R. Wayland, Jr., 500 Oakwood Pl. N.E., Albuquerque, N. Mex. 87123

[21] Appl. No.: 166,343

[22] Filed: Mar. 10, 1988

[51] Int. Cl.$^4$ .............................................. G01R 27/00
[52] U.S. Cl. .................................. 324/57 R; 324/61 R
[58] Field of Search ........................... 324/57 R, 61 R; 73/304 C, 61 R; 361/284; 364/509, 482

[56] References Cited

U.S. PATENT DOCUMENTS

| | | | |
|---|---|---|---|
| 3,181,557 | 5/1965 | Lannan, Jr. ........................ | 324/61 R |
| 3,695,108 | 10/1972 | Wygant .............................. | 324/61 P |
| 3,770,020 | 11/1973 | Tamura et al. ................... | 73/304 C |
| 3,777,257 | 12/1973 | Geisselmann ...................... | 324/61 R |
| 4,336,493 | 6/1982 | Gregory et al. .................. | 324/61 R |
| 4,503,383 | 3/1985 | Agar et al. ....................... | 324/61 P |
| 4,575,260 | 3/1986 | Young ................................. | 374/136 |
| 4,591,946 | 5/1986 | Pope ................................... | 73/304 C |
| 4,658,208 | 4/1987 | Lee et al. .......................... | 324/453 |

OTHER PUBLICATIONS

Sumner, "Principles of Induced Polarization for Geophysical Exploration", Elsevier Scient. Publishing Co., 1976, pp. 199–207.

Perry et al., "Chemical Engineer's Handbook", McGraw-Hill, 1973, pp. 42–47.

Primary Examiner—Reinhard J. Eisenzopf
Assistant Examiner—Anthony L. Miele

[57] ABSTRACT

Complex impedance measured over a predefined frequency range is used to determine the identity of different oils in a column. The location of an interface between the oils is determined from the percent frequency effects of the complex impedance measured across the interface.

4 Claims, 4 Drawing Sheets

IDENTIFICATION OF FLUIDS AND AN INTERFACE BETWEEN FLUIDS BY MEASURING COMPLEX IMPEDANCE

The United States Government has rights in this invention pursuant to Contract No. DE-AC04-76DP00789 between the Department of Energy and AT&T Technologies, Inc.

BACKGROUND OF THE INVENTION

This invention related to apparatus and method for identifying multiple fluids in a column and determining the level of their interface, and more particularly to apparatus and method for using complex impedances measured between spaced electrodes in the liquids for making the aforementioned identification.

Storage tanks, particularly in the petroleum industry, are often relatively inaccessible due to size or underground location. These tanks often contain a plurality of different types of fluid, such as different types of oil, separated into layers by differences in density. Operators of storage facilities must have the ability to identify the specific fluids in these tanks and the location of the interfaces between different fluids in order to manage their resources.

The oldest known identification technique has been sampling; i.e., the use of sampling ports along the side of the tank at different levels, or the use of a container lowered into the tank and allowed to fill with the fluid at the level under examination. Sampling is a labor-intensive, slow, process requiring the judgment of a person to identify a product by sensual observation of its characteristics.

There is inherent difficulty in using sensual observation to distinguish among different types of oils because these substances appear quite similar. Accordingly, the traditional method of identification has been by chemical analysis of samples. The use of electrical properties to identify oils in situ is not known to the petroleum industry.

Electrical properties of fluids have routinely been used to determine the level of a surface of a fluid. An RF capacitance unit was developed in the 1930's to identify the level of fluids that relied on the capacitance charge induced by the presence of a fluid between two electrodes or between an electrode and a metal tank wall. This system required careful calibration and maintenance, and the accuracy of the instrument was highly dependent on environmental parameters. Many subsequent patents have been issued to level detection schemes using changes in capacitance or other electrical parameters.

The use of complex impedance to determine the interface between two fluids is discussed by U.S. Pat. No. 4,503,383 of J. Agar et al. This patent has a sealed three foot long probe to reduce the capacitance of the probe. According to Agar's patent, the particular probe structure enables the detector to be arranged to respond to the impedance of the fluids, the impedance being primarily resistive rather than capacitive. A change in this impedance is indicative of an interface between oil and brine.

A system of identifying fluids using thermal properties is shown in U.S. Pat. No. 4,575,260 of A. Young. This patent uses a multi-leg bridge circuit to provide for heating of the fluid and for compensation for ambient temperature. The patent does not teach the use of electrical characteristics for identification of fluids.

SUMMARY OF THE INVENTION

It is an object of this invention to provide an electrical system for determining the identity of fluids in a column and the location of an interface between fluids of differing electrical characteristics.

It is another object of this invention to use complex impedance for fluid identification.

It is still another object to use percent frequency effect (PFE) to identify fluids and the interface between fluids of different electrical characteristics.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the present invention may comprise a method and apparatus for identifying fluids in a column comprising measuring at a plurality of different frequencies the complex impedance over a predetermined frequency range between spaced electrodes immersed in a fluid within the column, and determining the identity of said fluid from the measured information. In a particular embodiment, the identity of the fluid and the interface between many different fluids may be determined by calculating the percent frequency effect of complex impedance over a frequency range.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION

Figure 1:
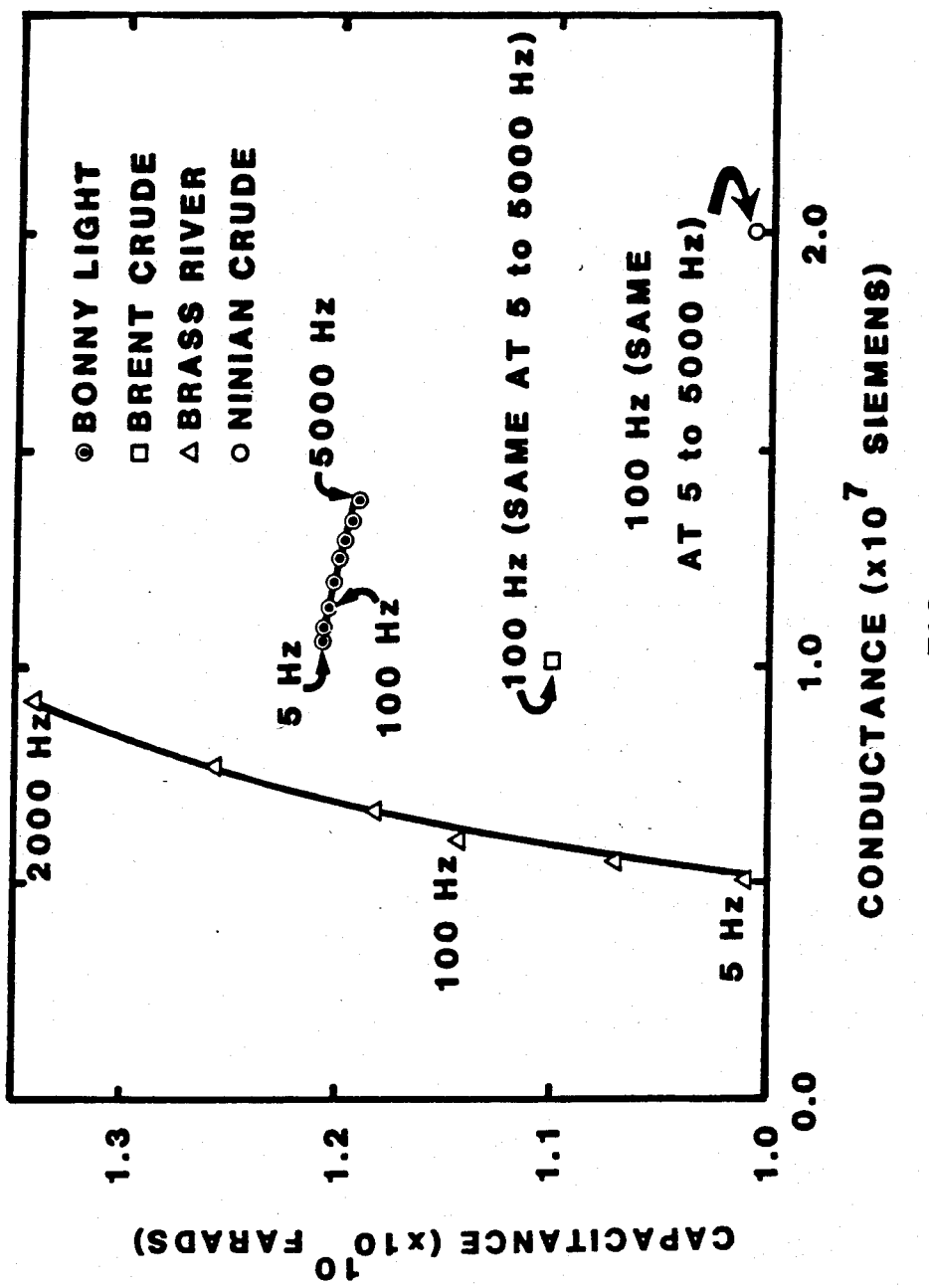
FIG. 1 shows the complex impedance over a frequency range for four types of oil.

This invention is based upon application of the knowledge that the complex impedance of many fluids presents a unique signature enabling the identification of these fluids, even though these fluids are similar in appearance to observers. FIG. 1 shows measured values of capacitance (the imaginary component of complex impedance) as a function of conductance (the real component of complex impedance) for four petroleum products identified, as is conventional in the art, by the location of their wells. Although all of these oils appear to be quite similar to the other oils, the impedance of each of these products is seen to be distinct, enabling the use of this measurement as a means for determining the identity of the product. Furthermore, the Brass River and Bonny Light products are seen to have capacitive or conductive values dependent upon the frequency at which the impedance is measured. This characteristic is useful in accordance with this invention as discussed hereinafter.

It should be understood that the complex impedance signatures for non petroleum products, such as water or brine, vary significantly from the values shown in FIG. 1 for four chemically similar petroleum products. Accordingly, the distinction of water or brine from petroleum is a relatively easy task.

Figure 2A:
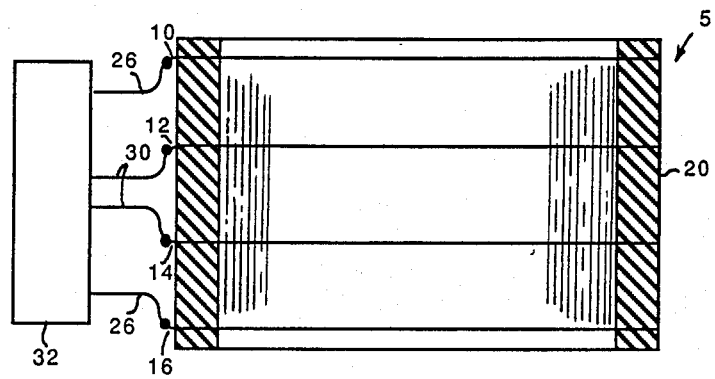
FIGS. 2A and 2B show two views of electrode which may be used for this invention, FIG. 2A being a partial sectional view taken along broken lines A—A of FIG. 2B.
Figure 2:
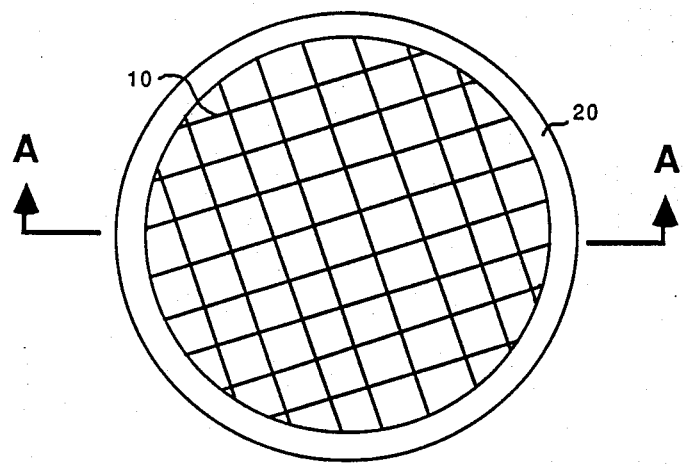

Measurement of complex impedance of fluids may be accomplished by generating an electric field in a fluid between two spaced electrodes, and measuring the voltage across two other electrodes within the electric field. FIG. 2A shows a side view, and FIG. 2B an end view, of a detector 5 showing one embodiment of an electrode arrangement for providing this measurement. Four circular electrodes 10, 12, 14, and 16, are spaced from each other by insulating stack 20. Each electrode is disclosed as a conductive grid permitting a flow of fluid through the grid openings. For each electrode, one conductor extends through stack 20 to serve as a lead for connecting the electrode to external circuitry.

The complex impedance of the fluid in detector 5 may be measured with a conventional impedance measuring device 32 such as a Hewlett-Packard Model HP4192A Impedance Analyzer. As shown in FIG. 2A, outer electrodes 10 and 16 may be connected through input leads 26 to an electric current provided by device 32. Similarly, inner electrodes 12 and 14 are connected through output leads 30 to the measuring terminals of device 32. In operation, current from device 32 flows through the fluid in detector 5, creating an electric field that is detected across electrodes 12 and 14. Device 32 uses the measured voltage to provide an output indicative of the complex impedance across terminals 12 and 14. By nulling the measured impedance prior to making a measurement, the effect of stack 20, any nearby tank structure (not shown), and leads 30 may be eliminated, providing an accurate measurement of fluid impedance.

For the detector 5 of FIGS. 2A and 2B, electrodes 10, 12, 14 and 16 were similar to the electrodes shown in FIG. 1 of the inventors' earlier U.S. Pat. No. 4,658,208. These electrodes have a diameter of approximately 50 mm (2 inches) and a grid spacing of approximately 6 mm (0.25 inch). The spacing between adjacent electrodes is also approximately 6 mm (0.25 inch).

It should be understood that detector structure is not too critical, and that many other structures may be used in the practice of this invention. For example, at the low frequencies of this invention, the grid appears to be a solid conductive plate to the fluid. Accordingly, the electrodes could be solid conductive sheets, and stack 20 could be provided with an opening to permit the flow of fluid between the electrodes. Furthermore, while detector 5 is shown as moveable within a fluid column, multiple sets of the spaced electrodes could be rigidly mounted in a fluid container, with detector 32 being switched among different sets to make measurements at different fluid levels. In addition, the simplest arrangement would be a string of point electrodes mounted along a rod or tank wall in a fluid column. A scan of four adjacent points could provide the impedance at that location.

Figure 3:
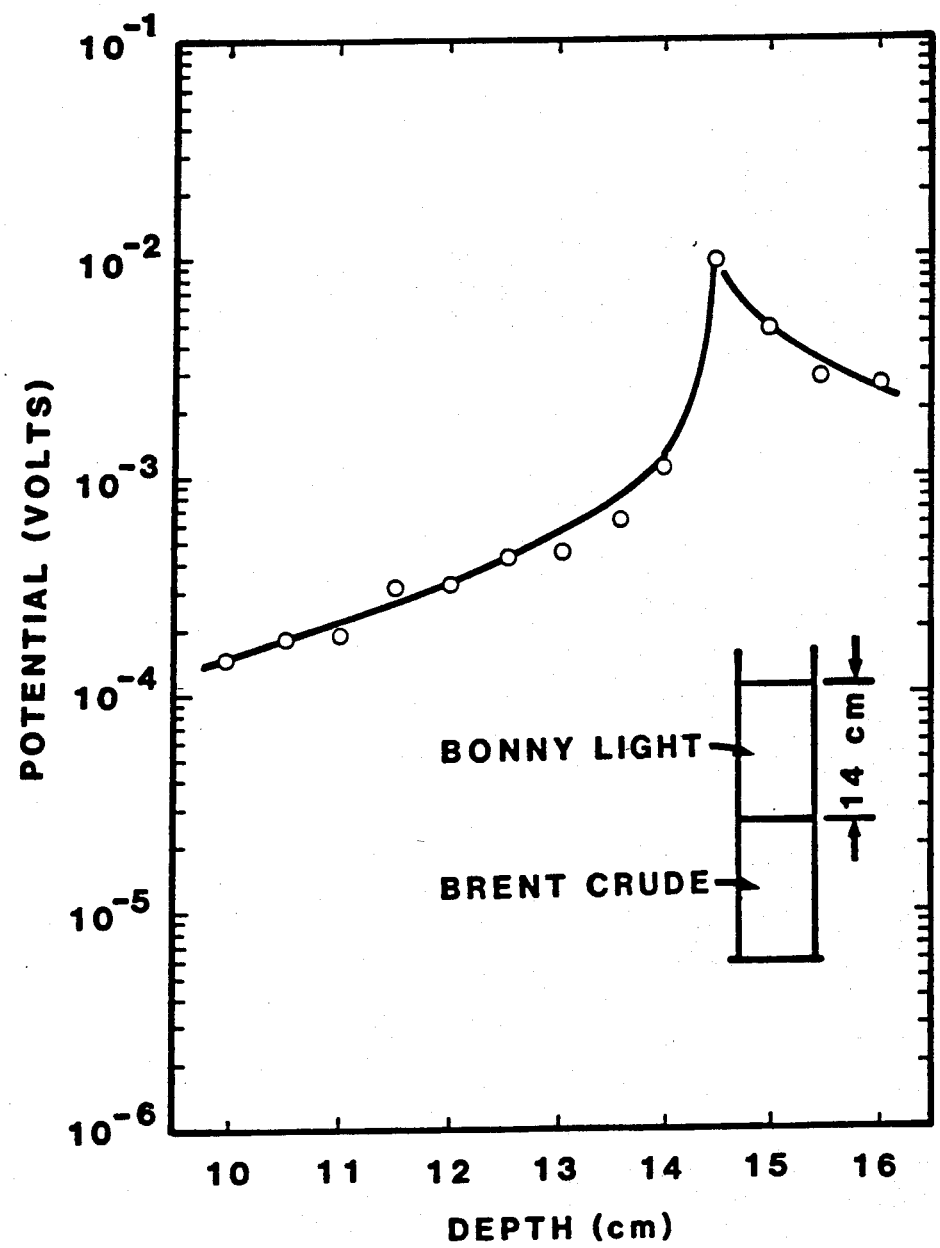
FIG. 3 shows a plot of electrode potential as a function of depth across an interface between two oils.

The invention further contemplates the use of signal processing to enhance the determination of an interface between different types of oil. FIG. 3 shows a measurement of potential across output terminals 12, 14 for a detector 5 moved through a column of oil having a 14 cm thick upper layer of Bonny Light and a lower layer of Brent Crude. As seen from FIG. 1, the complex impedance of these two products is relatively similar, Bonny Light being slightly more capacitive than Brent Crude and having an increase in conductance as a function of frequency. Because of these similarities in impedance, the interface is indicated by the data of FIG. 3 to be a modest cusp in the data. Failure of an operator to closely monitor the output as the detector passed the 14 cm level could cause him to miss the interface.

One manner in which the change in the detector output for FIG. 3 could be enhanced would be to measure the output with a differentiating voltmeter. Such a device would provide a positive output while the slope of the curve of FIG. 3 is increasing, and a negative output while the slope of the curve of FIG. 3 is decreasing.

Figure 4:
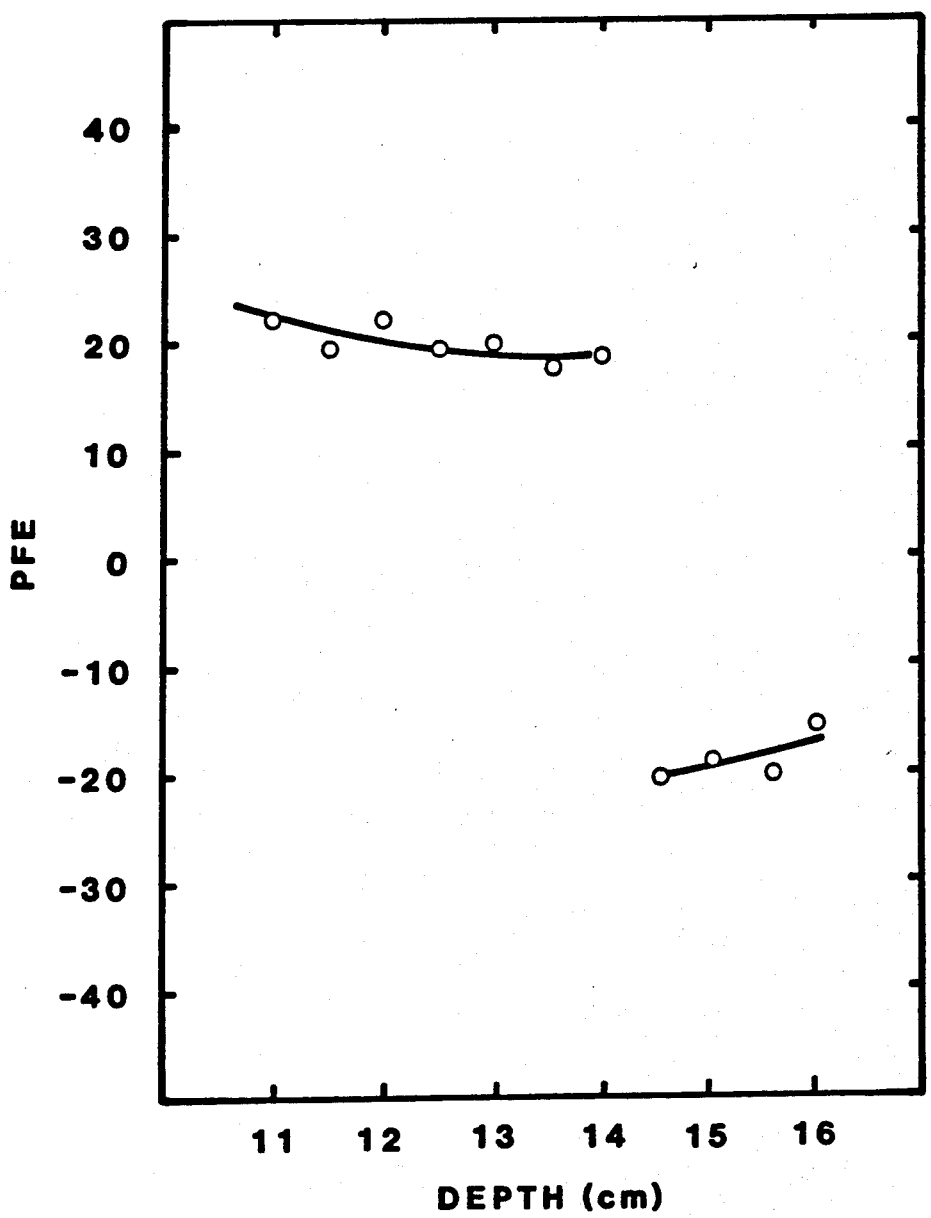
FIG. 4 shows a plot of percent frequency effect as a function of depth for the oils of FIG. 3.

Another manner for detecting the interface between oils is shown in FIG. 4, which figure shows the results of measuring the percent frequency effects (PFE) as a function of fluid level for the same fluids as in FIG. 3. PFE is a conventional measurement for geological formations that may be defined as follows:

$$PFE = \frac{(Z_{min} - Z_{max})}{Z_{max}} \times 100\%$$

where Z is any conveniently measured quantity that varies between a maximum and minimum value over a frequency range.

As seen from the data of FIG. 1, the impedance of Brent Crude is approximately $1.04 \times 10^{-7}$ ohm at 5 Hz and approximately $10^{-7}$ ohms at 5000 Hz (the capacitive contribution to the complex impedance approaches zero as the frequency increases), resulting in a PFE for Brent Crude of approximately 4%. However, the PFE for the complex impedance of Bonny Light is approximately 25%, because the impedance changes from a maximum value at 5 Hz of approximately $1.03 \times 10^{-7}$ ohms to a minimum value at 5000 Hz of approximately $0.71 \times 10^{-7}$ ohms, which values yield a PFE of approximately 31%. Accordingly, a detection system that made several impedance measurements over a predetermined frequency range for each fluid level, and which then calculated PFE from the minimum and maximum impedance measured over this range, would give a very distinct jump as it passed the interface between these two oils, as shown in FIG. 4.

Although the PFE is conventionally normalized to a percentage by dividing the difference between maximum and minimum impedance by one of the maximum or minimum values, one of ordinary skill in the art will readily understand that the term PFE may be applied to any function of a difference between maximum and minimum values over a frequency range.

It should be recognized that PFE does not provide an indication of the interface between fluids having similar PFE. For example, the PFE for the impedance of Ninian Crude shown in FIG. 1 is about 6%. PFE may not provide an accurate indication of the interface between Ninian Crude and Brent Crude with a PFE of about 4%. However, for other combinations of oils or other fluids with greater difference between PFE, the invention provides a clear indication of an interface.

The particular sizes and equipment discussed above are cited merely to illustrate a particular embodiment of this invention. It is contemplated that the use of the invention may involve components having different sizes and shaped as long as the principle, using complex impedance to identify apparently similar fluids, and using percent frequency effects of complex impedance to identify the interface between two of these fluids, is followed. It is intended that the scope of the invention be defined by the claims appended hereto.

We claim:

1. A method for identifying an interface between two different fluids comprising:
   measuring, at a plurality of different frequencies over a predetermined frequency range, the complex impedance between spaced electrodes immersed in a fluid;
   calculating a function of the difference between the maximum complex impedance and the minimum complex impedance measured over said frequency range for a plurality of different fluid levels; and
   using the fluid level of a discontinuity in said function as an indication of the location of an interface between different fluids.

2. Apparatus for identifying an interface between two different fluids comprising:
   means for measuring, at a plurality of different frequencies over a predetermined frequency range, the complex impedance between spaced electrodes immersed in the fluids; and
   means for calculating a function of the difference between the maximum complex impedance and the minimum complex impedance measured over said frequency range for a plurality of different fluid levels; wherein a discontinuity in said function is an indication of the location of an interface between different fluids.

3. The apparatus of claim 2 wherein said fluids are contained within a column.

4. The apparatus of claim 2 wherein said calculated function is the percent frequency effects.

* * * * *

UNITED STATES PATENT AND TRADEMARK OFFICE
CERTIFICATE OF CORRECTION

PATENT NO. : 4,885,529

DATED : December 5, 1989

INVENTOR(S) : David O. Lee and James R. Wayland, Jr.

It is certified that error appears in the above-identified patent and that said Letters Patent is hereby corrected as shown below:

Title page:

column 2, after "Assistant Examiner- Anthony L. Miele", and before "[57] ABSTRACT", insert -- Attorney, Agent, or Firm - George H. Libman; James H. Chafin; Judson R. Hightower--.

Signed and Sealed this

Twenty-first Day of January, 1992

Attest:

HARRY F. MANBECK, JR.

*Attesting Officer*   *Commissioner of Patents and Trademarks*